United States Patent
Lin et al.

(10) Patent No.: US 7,008,732 B2
(45) Date of Patent: Mar. 7, 2006

(54) PHOTOMASK PATTERN

(75) Inventors: Chin-Lung Lin, Hsinchu Hsien (TW); Chuen-Huei Yang, Taipei (TW); Wen-Tien Hung, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 247 days.

(21) Appl. No.: 10/457,978

(22) Filed: Jun. 9, 2003

(65) Prior Publication Data

US 2004/0229131 A1    Nov. 18, 2004

(30) Foreign Application Priority Data

May 14, 2003 (TW) ................................ 92113045 A

(51) Int. Cl.
*G03F 9/00* (2006.01)
(52) U.S. Cl. ............................................. 430/5; 430/30
(58) Field of Classification Search .................... 430/5, 430/30
See application file for complete search history.

(56) References Cited

U.S. PATENT DOCUMENTS 6,800,402 B1 * 10/2004 Fujimoto ........................ 430/5

* cited by examiner

*Primary Examiner*—Christopher G. Young
(74) *Attorney, Agent, or Firm*—J.C. Patents

(57) ABSTRACT

A photomask pattern on a substrate is provided. The photomask pattern comprises a main pattern and a sub-resolution assistant feature. The sub-resolution assistant feature is located on the sides of the main pattern. Furthermore, the sub-resolution assistant feature comprises a first assistant feature and a second assistant feature. The first assistant feature is formed close to the main pattern and the second assistant feature is formed further away from the main pattern but adjacent to the first assistant feature. There is a phase difference of 180° between the first assistant feature and the main pattern. Similarly, there is a phase difference of 180° between the second assistant feature and the first assistant feature. Since the main pattern is bordered by reverse-phase assistant feature, exposure resolution of the photomask is increased.

20 Claims, 3 Drawing Sheets

PHOTOMASK PATTERN

CROSS-REFERENCE TO RELATED APPLICATION

This application claims the priority benefit of Taiwan application serial no. 92113045, filed May 14, 2003.

BACKGROUND OF THE INVENTION

1. Field of Invention

The present invention relates to a photomask pattern. More particularly, the present invention relates to a high-resolution photomask pattern.

2. Description of Related Art

In recent years, the semiconductor industry has been in favor of producing miniature circuit devices. One of the most critical aspects in miniaturizing circuit devices in semiconductor process is photolithography. The critical dimension of any related structure of a semiconductor device such as various thin films and patterns depends on the resolution in the photolithographic process. Since the accuracy of the photomask pattern transfer directly affects the tolerance of critical dimensions on a chip, and increasing the resolution of the photomask is very important.

To increase the resolution of photomask pattern, two major methods are deployed. One method is to use a binary chrome mask together with an off-axis illumination (OAI) to serve as a light source for the photo-exposure. Alternatively, an attenuated phase-shift mask (APSM) together with an off-axis illumination (OAI) is used to perform the photo-exposure process. The concept behind the attenuated phase-shift mask method is to add suitable material to the pattern area so that there is a phase difference of 180° between the patterned and non-patterned area and that the mask has a sufficiently high degree of transparency for high productivity.

However, the aforementioned photolithographic processes can hardly keep up with the decreasing critical dimensions demanded for miniaturized products so that the uniformity of critical dimensions is varied.

SUMMARY OF THE INVENTION

Accordingly, an object of the present invention is to provide a photomask pattern for increasing the resolution of a photolithographic process.

An object of this invention is to provide a photomask pattern for increasing the contrast of trench features.

An object of this invention is to provide a photomask pattern that permits feature miniaturization without compromising the uniformity of critical dimensions.

To achieve these and other advantages and in accordance with the purpose of the invention, as embodied and broadly described herein, the invention provides a photomask pattern. The photomask pattern includes a main pattern and a plurality of sub-resolution assistant features. The sub-resolution assistant features are located along the edge of the main pattern. Each sub-resolution assistant feature furthermore comprises a first assistant feature and a second assistant feature. The first assistant feature is set up close to the main pattern and the second assistant feature is set up further away from the main pattern but adjacent to the first assistant feature. There is a 180° phase difference between the first assistant feature and the main pattern. Similarly, there is a 180° phase difference between the second assistant feature and the first assistant feature.

This invention also provides a photomask pattern. The photomask pattern includes a plurality of main patterns, a plurality of first sub-resolution assistant features and a plurality of second sub-resolution assistant features. The first sub-resolution assistant features are set up between the main patterns. Each first sub-resolution assistant feature has an odd number of assistant features. While there is a 180° phase difference between the odd-numbered assistant features and the main pattern; and there is 0° phase difference between the even-numbered assistant features and the main pattern. The second sub-resolution assistant features are located along the edges of the main patterns. Each second sub-resolution assistant feature furthermore comprises a first assistant feature and a second assistant feature. The first assistant feature is set up close to the main pattern and the second assistant feature is set up further away from the main pattern but adjacent to the first assistant feature. There is a 180° phase difference between the first assistant feature and the main pattern. Similarly, there is a 180° phase difference between the second assistant feature and the first assistant feature.

In this invention, sub-resolution assistant features are set up along the edge of main patterns so that there is a 180° phase difference between the first assistant features of the sub-resolution assistant feature and the main pattern leading to a destructive interference of light and an increase in contrast. In the meantime, since the first assistant features and the second assistant feature in the sub-resolution assistant feature are 180° out of phase, light passing through the first and the second assistant feature will cancel each other out and hence produce no images. In other words, these assistant features increase the resolution of the photo-exposure operation and hence increase the process window of the photolithographic process.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
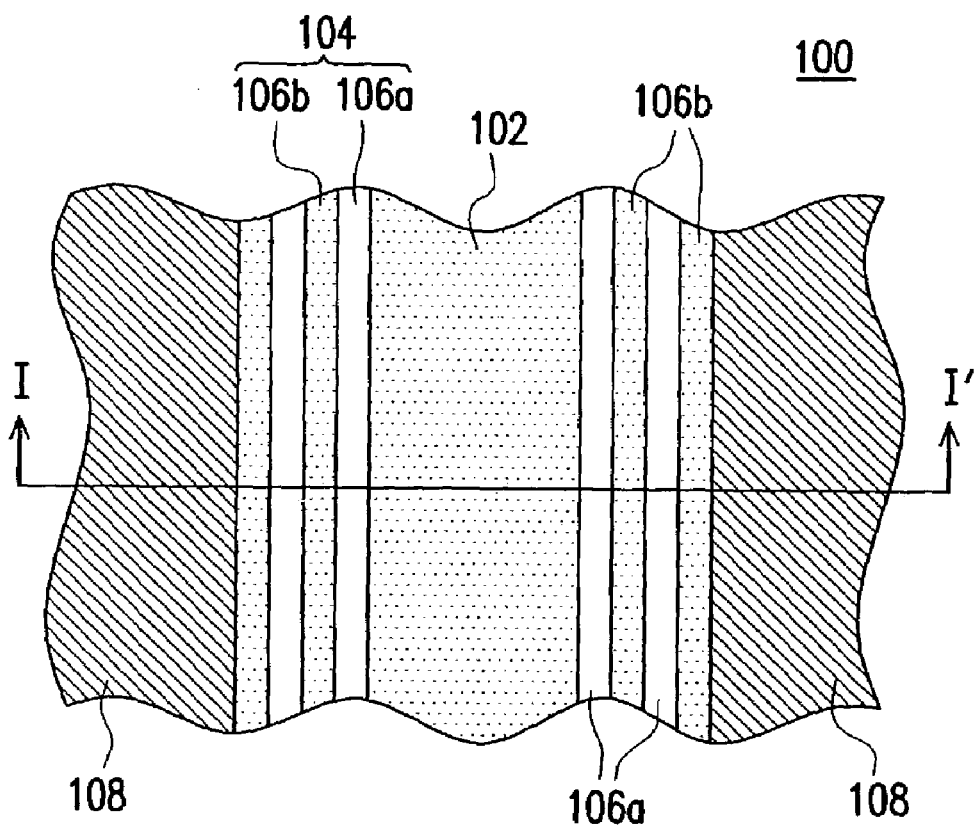
FIG. 1A is a schematic top view of a photomask pattern according to a first embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A is a schematic top view of a photomask pattern according to a first embodiment of this invention. As shown in FIG. 1A, the photomask pattern 100 of this invention comprise a main pattern 102 and a sub-resolution assistant feature (SRAF) 104. The sub-resolution assistant feature 104 is, for example, an alternating phase-shift mask fabricated using a molybdenum silicide compound ($MoSi_zO_xN_y$) or silicon oxy-nitride compound ($SiO_xN_y$). The sub-resolution assistant feature 104 is positioned along the edge of the main pattern 104. Furthermore, the sub-resolution assistant feature 104 comprises a first assistant feature 106a and a second assistant feature 106b. The first assistant feature 106a is set up close to the main pattern 102. The second assistant feature 106b is set up further away from the main pattern 102 but adjacent to the first assistant pattern 106a. There is a phase difference of 180° between the first assistant feature 106a and the main pattern 102. Similarly, there is a phase difference of 180° between the second assistant feature 106b and the first assistant feature 106a. Both the first assistant feature 106a and the second assistant feature 106b preferably have an identical size dimension.

As shown in FIG. 1A, the main pattern 102 is set to have a 180° phase. Hence, the first assistant feature 106a of the photomask pattern 100 must have a 0° phase and the second assistant feature 106b of the photomask pattern 100 must have a 180° phase. Furthermore, although the sub-resolution assistant feature 104 in FIG. 1A has four strips on each side of the main pattern 102, the actual number of strips is a variable. In fact, the number of strips alongside the main pattern often depends on actual requirements and density considerations. Thus, it is feasible to have a sub-resolution assistant pattern 104 with one, two or more than two strips on each side of the main pattern 102. In addition, the photomask pattern 100 may further include a shielding layer 108.

Figure 1B:
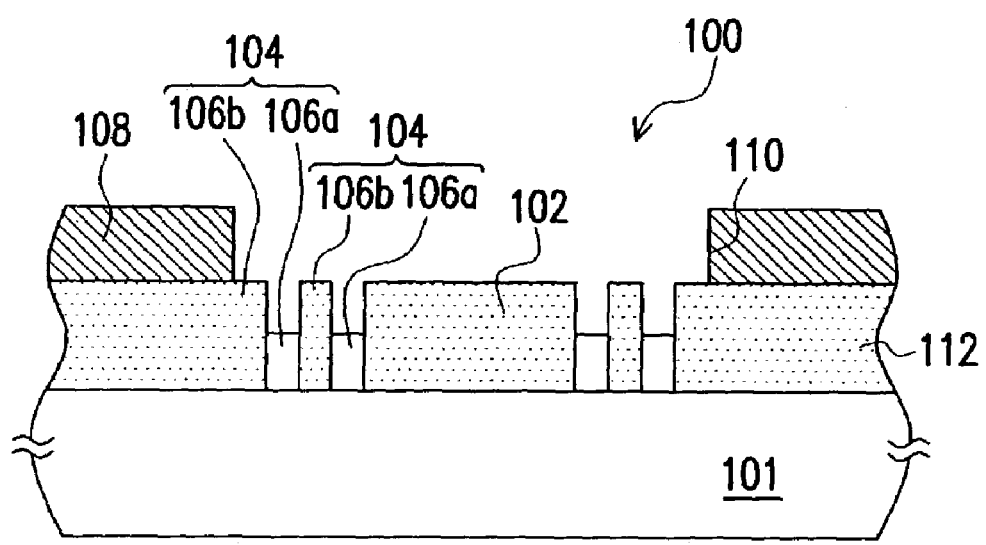
FIG. 1B is a cross-sectional view along line I–I' of the photomask pattern in FIG. 1A.

FIG. 1B is a cross-sectional view along line I–I' of the photomask pattern in FIG. 1A. Aside from the photomask pattern 100 over a substrate 101 such as a quartz substrate as shown in FIG. 1A, a shielding layer 108 is also formed over the photomask pattern 100. The shielding layer 108 has an opening 110 that exposes the main pattern 102 and the sub-resolution assistant features 104. Moreover, if the main pattern 102 is a 180° phase pattern, the shielding layer 108 may be selectively positioned on the substrate 101 outside the main pattern 102 and on the substrate 101 outside the first assistant feature 106a of the sub-resolution assistant feature 104 furthest away from the main pattern 102.

With the sub-resolution assistant feature 104 lining the side of the main pattern 102 and a 180° phase difference between the main pattern 102 and the first assistant feature 106a of the sub-resolution assistant feature 104, a destructive interference of incoming light will occur leading to a greater contrast. In the meantime, due to a phase difference of 180° between the first assistant feature 106a and the second assistant feature 106b, a destructive interference will occur to cancel each other out and ensure no secondary image is formed. In brief, the assistant features along the side of the main pattern 102 increase the resolution of the photo-exposure operation and hence increase the process window of the photolithographic process.

Figure 2A:
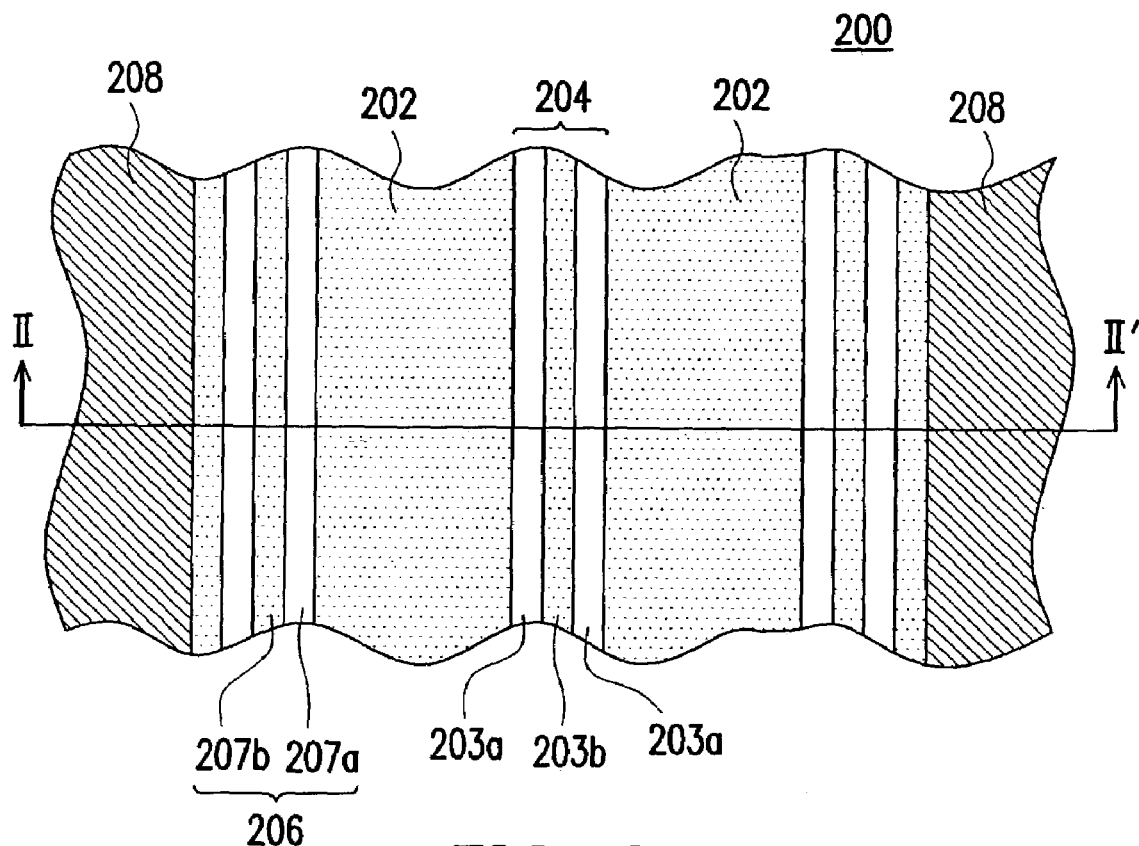
FIG. 2A is a schematic top view of a photomask pattern according to a second embodiment of this invention.

FIG. 2A is a schematic top view of a photomask pattern according to the second embodiment of this invention. As shown in FIG. 2A, the photomask pattern 200 of this invention comprise a plurality of main patterns 202, a plurality of first sub-resolution assistant features 204 and a plurality of second sub-resolution assistant features 206. The first sub-resolution assistant features 204 and the second sub-resolution assistant features 206 are, for example, an alternating phase-shift mask fabricated using a molybdenum suicide compound ($MoSi_zO_xN_y$) or silicon oxy-nitride compound ($SiO_xN_y$). The first sub-resolution assistant features 204 are set up between the main patterns 202. Each first sub-resolution assistant feature 204 has an odd number of assistant features 203a and 203b. There is a 180° phase difference between the odd-numbered assistant features 203a and the main pattern 202. On the other hand, there is no phase difference (or a 0° phase difference) between the even-numbered assistant features 203b and the main pattern 202. The second sub-resolution assistant features 206 are positioned along the outer edges of the main pattern 202. Each second sub-resolution assistant feature 206 comprises a first assistant feature 207a and a second assistant feature 207b. The first assistant feature 207a is set up close to the main pattern 202. The second assistant feature 207b is set up further away from the main pattern 202 but adjacent to the first assistant pattern 207a. There is a phase difference of 180° between the first assistant feature 207a and the main pattern 202. Similarly, there is a phase difference of 180° between the second assistant feature 207b and the first assistant feature 207a. Both the first assistant feature 207a and the second assistant feature 207b preferably have an identical size dimension.

As shown in FIG. 2A, the main patterns 202 are set to have a 180° phase. Hence, the odd-numbered assistant features 203a of the first sub-resolution assistant feature 204 must have a 0° phase and the even-numbered assistant features 203b must have a 180° phase. Similarly, the first assistant feature 207a of the second sub-resolution assistant feature 206 must have a 0° phase and the second assistant feature 207b of the second sub-resolution assistant feature 206 must have a 180° phase. Furthermore, although two main pattern 202 strips are shown in FIG. 2A, the actual number of main pattern 202 strips is a variable.

Although the number of strips in each first sub-resolution assistant feature 204 is three and in each second sub-resolution assistant features 206 is four in FIG. 2A, the number of strips in each first or second sub-resolution assistant feature 204 or 206 often depends on actual requirement and density consideration, and, in particular, depends on the separation between the two main patterns 202. Hence, it does not matter whether the number of strips in the first sub-resolution assistant pattern 204 between various main patterns 202 is one, three or an odd number greater than three, or the number of strips in the second sub-resolution assistant pattern 206 alongside the outer edge of the main pattern 202 is one, two or more than two. In addition, the photomask pattern 200 may further include a shielding layer 208.

Figure 2B:
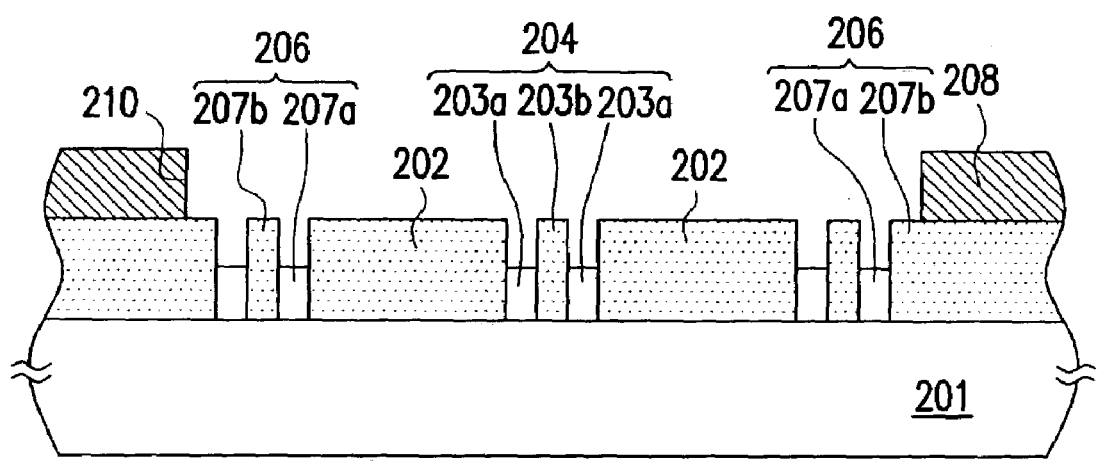
FIG. 2B is a cross-sectional view along line II–II' of the photomask pattern in FIG. 2A.

FIG. 2B is a cross-sectional view along line II–II' of the photomask pattern in FIG. 2A. Besides the photomask pattern 200 over a substrate 201 such as a quartz substrate as shown in FIG. 2A, a shielding layer 208 is also formed over the photomask pattern 200 as shown in FIG. 2B. The shielding layer 208 has an opening 210 that exposes the main patterns 202, the first sub-resolution assistant features 204 and the second sub-resolution assistant features 206. Moreover, if the main pattern 202 is a 180° phase pattern, the shielding layer 208 may be selectively positioned on the main pattern 202 or on the substrate 201 outside the first sub-resolution assistant features 204 and on the substrate 201 outside the first assistant features 207a of the second sub-resolution assistant pattern 206 furthest from the main pattern 202.

Figure 3:
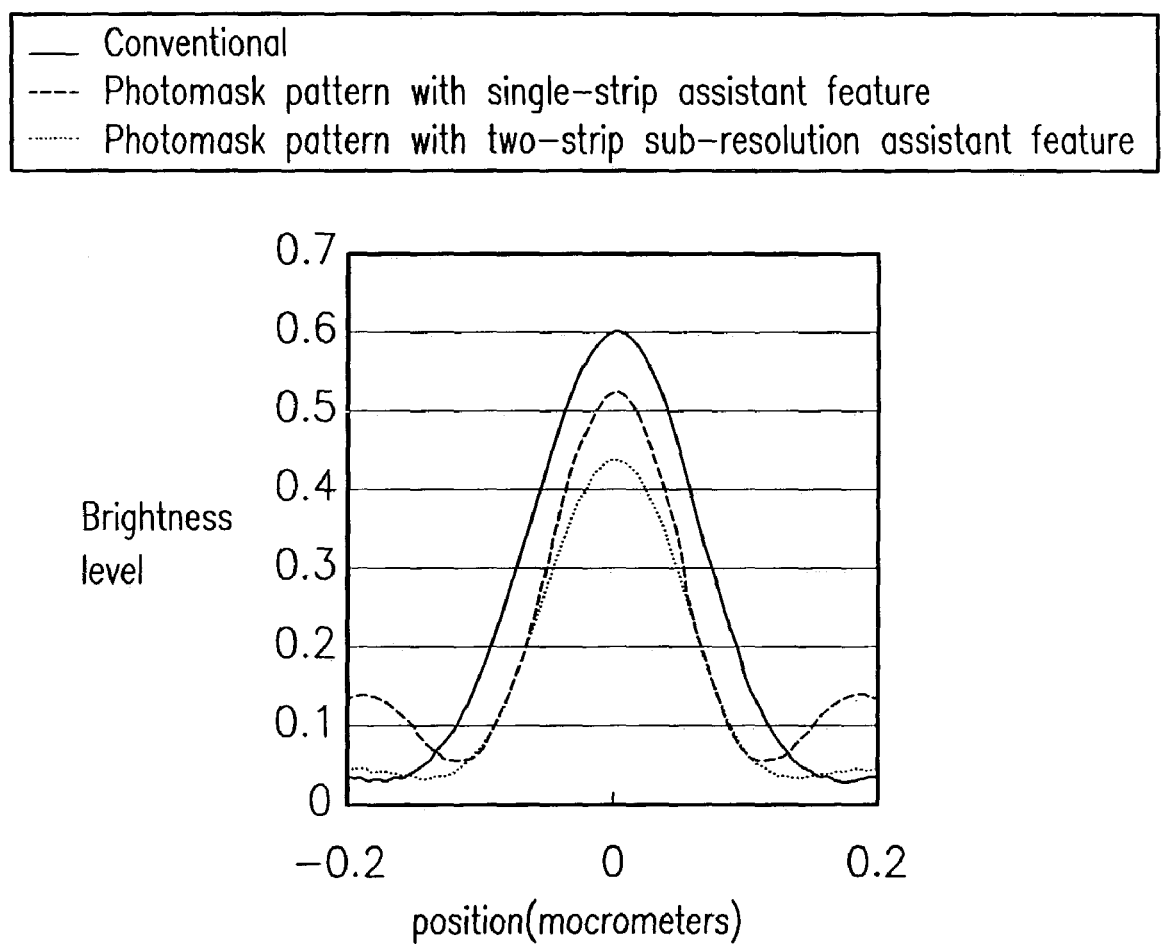
FIG. 3 is a graph comparing the brightness level versus pattern location relationship between a conventional chrome film mask pattern and the photomask patterned according to the first embodiment of this invention.

FIG. 3 is a graph comparing the brightness level versus pattern location relationship between a conventional chrome film mask pattern and the photomask patterned according to the first embodiment of this invention. The results of using a conventional photomask and the photomask pattern in a photo-exposure operation are shown in FIG. 3. At a brightness level greater than 0.5, the area covered by the curve using a conventional mask is obviously greater than the area covered by the curve using the photomask having feature pattern according to this invention. Furthermore, it does not matter whether the sub-resolution assistant feature on each side of the main pattern has one strip or two strips, the same results are obtained. Thus, this invention clearly improves the resolution of the photo-exposure process.

Since sub-resolution assistant features are set up along the edge of main patterns so that there is a 180° phase difference between the main pattern and the assistant features closest to the main pattern, destructive interference of light will occur and hence lead to an increase in contrast. In the meantime, the sub-resolution assistant feature is made up of two portions that are 180° out of phase with each other. Hence, light passing through these two portions will cancel each other out and produce no images. In other words, these assistant features increase the resolution of the photo-exposure operation and hence increase the process window of photolithographic process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A photomask pattern formed on a substrate, comprising:
   a main pattern; and
   at least a sub-resolution assistant feature located on the sides of the main pattern, wherein each sub-resolution assistant feature furthermore comprises:
      a first assistant feature close to the main pattern, wherein the phase difference between the first assistant feature and the main pattern is 180°; and
      a second assistant feature further away from the main pattern but adjacent to the first assistant feature, wherein the phase difference between the second assistant feature and the first assistant feature is 180°.

2. The photomask pattern of claim 1, wherein the main pattern has a 180° phase.

3. The photomask pattern of claim 2, wherein the photomask furthermore comprises a shielding layer covering the substrate outside the main pattern and the substrate outside the first assistant feature of the sub-resolution assistant feature furthest from the main pattern.

4. The photomask pattern of claim 1, wherein the photomask furthermore comprises a shielding layer covering the substrate with an opening that exposes the main pattern and the sub-resolution assistant feature.

5. The photomask pattern of claim 1, wherein the first assistant feature and the second assistant feature has an identical size dimension.

6. The photomask pattern of claim 1, wherein the sub-resolution assistant feature comprises an alternating phase shift mask.

7. The photomask pattern of claim 1, wherein substrate comprises a quartz substrate.

8. A photomask pattern formed on a substrate, comprising:
   a plurality of main patterns;
   at least a first sub-resolution assistant feature located between main patterns with each first sub-resolution assistant feature having an odd number of assistant features, wherein the phase difference between the odd-numbered assistant features and the main pattern is 180°, and the phase difference between the even-numbered assistant features and the main pattern is 0°; and
   a plurality of second sub-resolution assistant feature located on the outer edges of the main patterns, wherein each second resolution assistant feature furthermore comprises:
      a first assistant feature close to the main pattern, wherein the phase difference between the first assistant feature and the main pattern is 180°; and
      a second assistant feature further away from the main pattern but adjacent to the first assistant feature, wherein the phase difference between the second assistant feature and the first assistant feature is 180°.

9. The photomask pattern of claim 8, wherein the main pattern has a 180° phase.

10. The photomask pattern of claim 9, wherein the photomask furthermore comprises a shielding layer covering the substrate outside the main pattern, the substrate outside the first sub-resolution assistant feature and the substrate outside the first assistant feature of the second sub-resolution assistant feature furthest from the main pattern.

11. The photomask pattern of claim 9, wherein the photomask furthermore comprises a shielding layer covering the substrate with an opening that exposes the main patterns, the first sub-resolution assistant features and the second sub-resolution assistant features.

12. The photomask pattern of claim 9, wherein the first assistant feature and the second assistant feature has an identical size dimension.

13. The photomask pattern of claim 9, wherein the first sub-resolution assistant features and the second sub-resolution assistant features comprise alternating phase shift masks.

14. The photomask pattern of claim 9, wherein substrate comprises a quartz substrate.

15. A photomask pattern formed on a substrate, comprising:
   a plurality of main patterns;
   a first sub-resolution assistant feature located between main patterns, wherein the first sub-resolution assistant feature has an odd number of assistant features comprising at least two first assistant features and at least one second assistant feature, the second assistant feature and the first assistant features are alternately arranged with that each of the main patterns is directly adjacent to one of the first assistant feature, and the phase difference between the first assistant features and the main patterns is 180°, and the phase difference between the second assistant features and the main pattern is 0°; and
   a plurality of second sub-resolution assistant feature located on the outer edges of the whole of the main patterns, wherein each second resolution assistant feature furthermore comprises:
      a third assistant feature located directly close to the main pattern, wherein the phase difference between the third assistant feature and the main pattern is 180°; and a fourth assistant feature further away from the main pattern but directly adjacent to the third assistant feature, wherein the phase difference between the fourth assistant feature and the third assistant feature is 180°.

16. The photomask pattern of claim 15, wherein the main pattern has a 180° phase.

17. The photomask pattern of claim 16, wherein the photomask furthermore comprises a shielding layer covering the substrate outside the whole of the main patterns, the second sub-resolution assistant feature.

18. The photomask pattern of claim 16, wherein the photomask furthermore comprises a shielding layer covering the substrate with an opening that exposes the main patterns, the first sub-resolution assistant features and the second sub-resolution assistant features.

19. The photomask pattern of claim 16, wherein the first assistant feature and the second assistant feature has an identical size dimension.

20. The photomask pattern of claim 16, wherein the third assistant feature and the fourth assistant feature has an identical size dimension.

* * * * *